United States Patent
Masuda et al.

[19]

[11] Patent Number: 6,049,163
[45] Date of Patent: Apr. 11, 2000

[54] DISCHARGE LAMP UNIT WITH RF SHIELD PRIMARY COIL

[75] Inventors: Kenichi Masuda; Tutomu Hasegawa; Fuminori Teramoto, all of Tsurugashima, Japan

[73] Assignee: Honda Giken Kogyo Kabushiki Kaisha, Tokyo, Japan

[21] Appl. No.: 09/013,955

[22] Filed: Jan. 27, 1998

[30] Foreign Application Priority Data

Jan. 28, 1997 [JP] Japan ..................................... 9-049550

[51] Int. Cl.[7] ..................................................... H01F 27/32
[52] U.S. Cl. ........................ 313/318.12; 315/276; 315/57; 439/620; 361/674
[58] Field of Search ........................ 313/318.01, 318.03, 313/318.09, 318.1, 318.12; 315/227 R, 239, 274, 276, 57; 439/602, 613, 620; 361/674

[56] References Cited

U.S. PATENT DOCUMENTS 3,894,266  7/1975  Sovza .................................... 315/227 R

FOREIGN PATENT DOCUMENTS 8-130127  5/1996  Japan .............................. H01F 27/32

*Primary Examiner*—Michael H. Day
*Attorney, Agent, or Firm*—Lyon & Lyon LLP

[57] ABSTRACT

A discharge lamp unit has a housing provided with a lamp socket fitted thereon and accommodating a printed circuit board with a lamp lighting circuit and a high voltage generating transformer assembly mounted thereon. The transformer assembly consists of a primary coil being a plate conductor spirally wound around a coil case containing a secondary coil-wound bobbin with a core inserted in a hollow center thereof. The discharge lamp unit is formed as a single solid device by potting all of the components in the housing with insulating resin poured in a melted state and solidified therein. This unit is easy to mount with no need for laying a high-voltage between the circuitry and the lamp socket, and includes a very compact and light transformer having an increased conversion efficiency of the primary and secondary coils.

3 Claims, 6 Drawing Sheets

+E
GND

+E
GND

DISCHARGE LAMP UNIT WITH RF SHIELD PRIMARY COIL

BACKGROUND OF THE INVENTION

The present invention relates to discharge lamp units used as headlights of a vehicle and so on.

With conventional discharge lamps used as headlights of a vehicle, lamp sockets are provided in respective lamp-mounting places of the vehicle and lamp-lighting circuit units each containing a high-voltage generating transformer with a control circuit assembled on a printed circuit board are separately mounted in a bonnet of the vehicle, then the lamp-lighting units are connected to the respective lamp sockets by using separate high-voltage cables.

There has been developed a compact and light-weight high-voltage generating transformer which has a coil case having an insert-formed primary coil (conducting plate) and a secondary-coil-wound bobbin with a core inserted in a hollow center thereof (as disclosed in Japanese Laid-open Patent No. 8-130127). This type of transformer, however, has a constructional deficiency that the coil case is partially opened (i.e., the secondary coil bobbin is not completely enclosed by the conductive plate).

As described above, the conventional discharge lamp unit requires separate arrangement of a lamp socket apart from the lamp lighting circuit unit and interconnection of them by using a high-voltage cable. This complicates the mounting work of the unit.

Furthermore, the use of elongated high-voltage cable may be associated with the risk of a leak current therefrom and reduction of the output voltage of the discharge lamp unit.

SUMMARY OF THE INVENTION

Accordingly, an object of the present invention is to provide a discharge lamp unit which is easy to mount with no need for laying a high-voltage cable and is free from the risk of leakage current from its compact high-voltage generating transformer and which, therefore, has a housing provided with a lamp socket fitted thereon and accommodating therein a printed circuit board implemented with a lamp lighting circuit and a high-voltage generating transformer assembly consisting of a coil case containing a secondary-coil-wound bobbin with a core inserted in a hollow center thereof and having a primary coil being a conducting plate spirally wound around the coil case and is formed as a single solid device by potting the inner components in the housing with insulating resin poured in a melted state and solidified therein.

DESCRIPTION OF THE PREFERRED EMBODIMENTS

Figure 1:
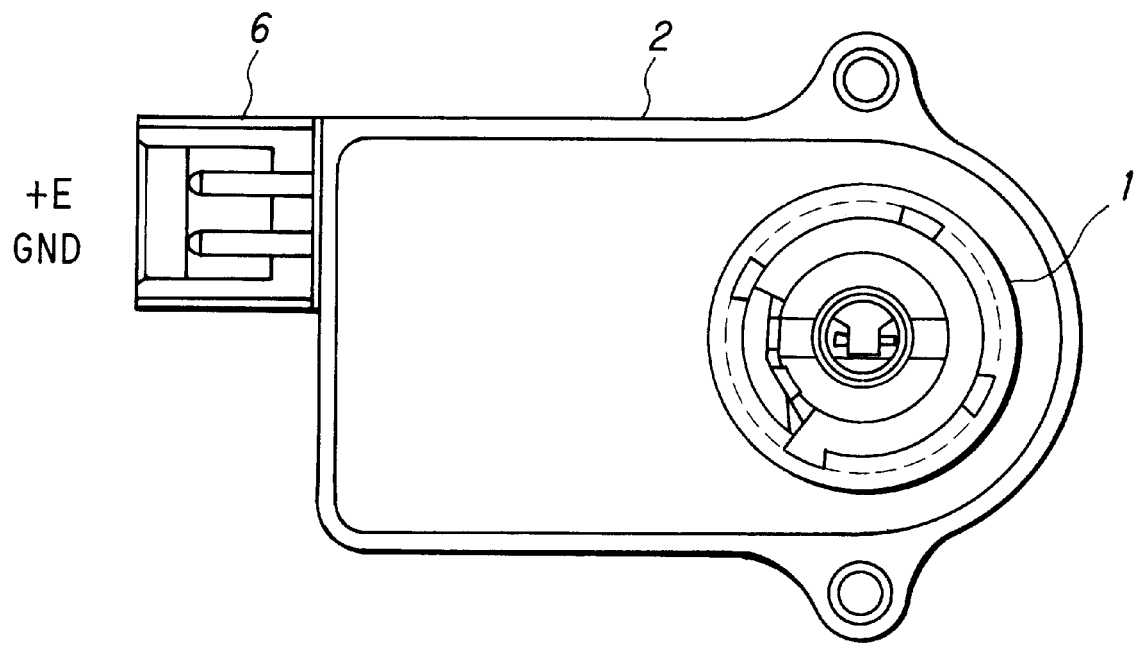
FIG. 1 is a plan view of a discharge lamp unit according to an aspect of the present invention.
Figure 2:
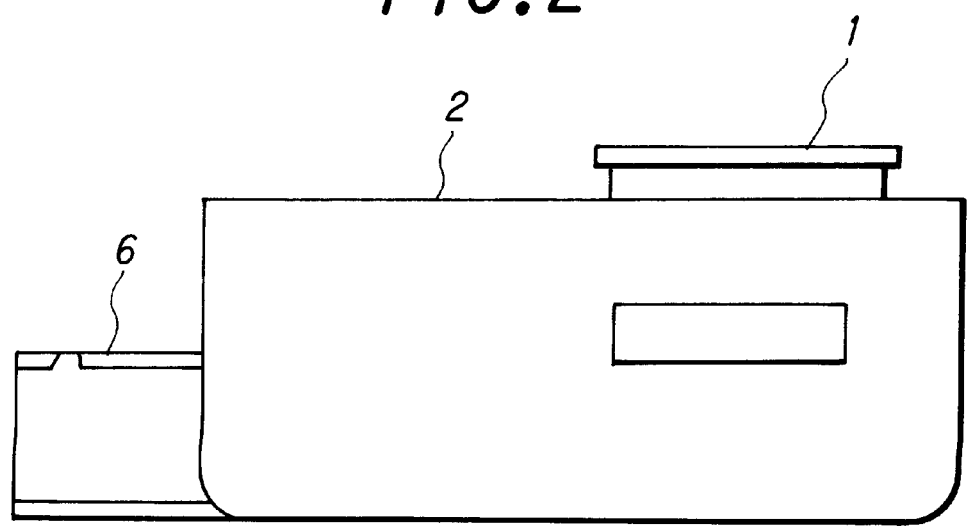
FIG. 2 is a front elevation view of the discharge lamp unit of FIG. 1.
Figure 3:
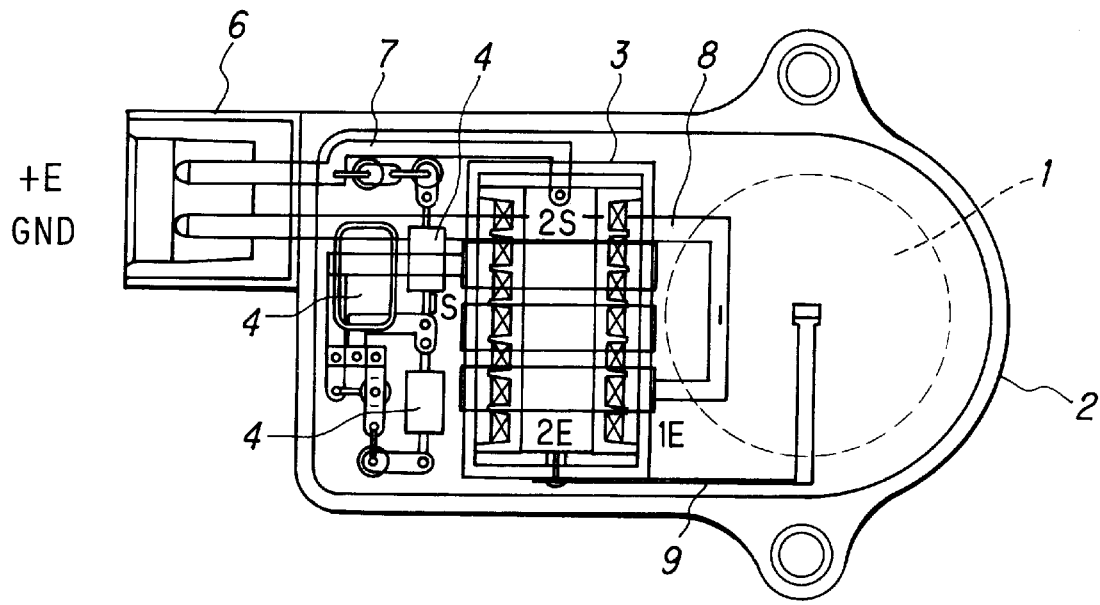
FIG. 3 is a sectional plan view of the discharge lamp unit of FIG. 1.
Figure 4:
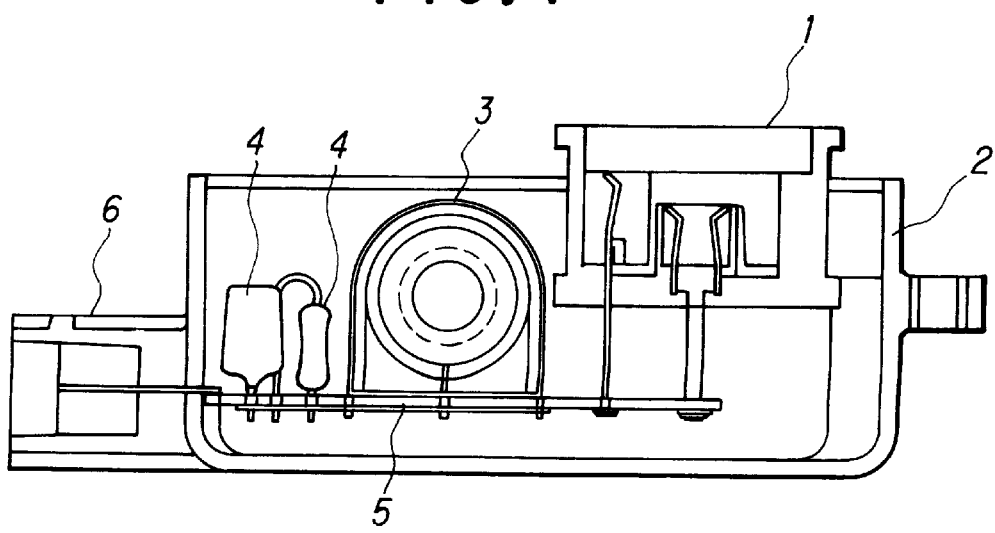
FIG. 4 is a longitudinal sectional view of the discharge lamp unit of FIG. 1.

The preferred embodiments of the present invention will now be described in detail by way of example and with reference to the accompanying drawings.

In FIGS. 1 to 4, a discharge lamp unit according to the present invention comprises a housing 2 with a lamp socket 1 fitted thereon and accommodating therein a printed circuit board 5 implemented with elements 4 of a lamp lighting circuit together with a high-voltage generating transformer assembly and is formed as a single solid unit by potting all of the inserted components in the housing 2 with insulating resin poured in a melted state and solidified therein. The housing 2 has a power supply socket 6 integrally formed thereon. A lead wire (conductor) 7 extending from a terminal "+E" of the power source is connected to a secondary-side low-voltage terminal 2S of the high-voltage generating transformer and a lead wire 8 extending from a terminal "GND" of the power source socket is connected to the high-voltage-side terminal 2E of the transformer. The high-voltage-side terminal 2E is connected to the socket 1 with a lead wire 9.

Figure 5:
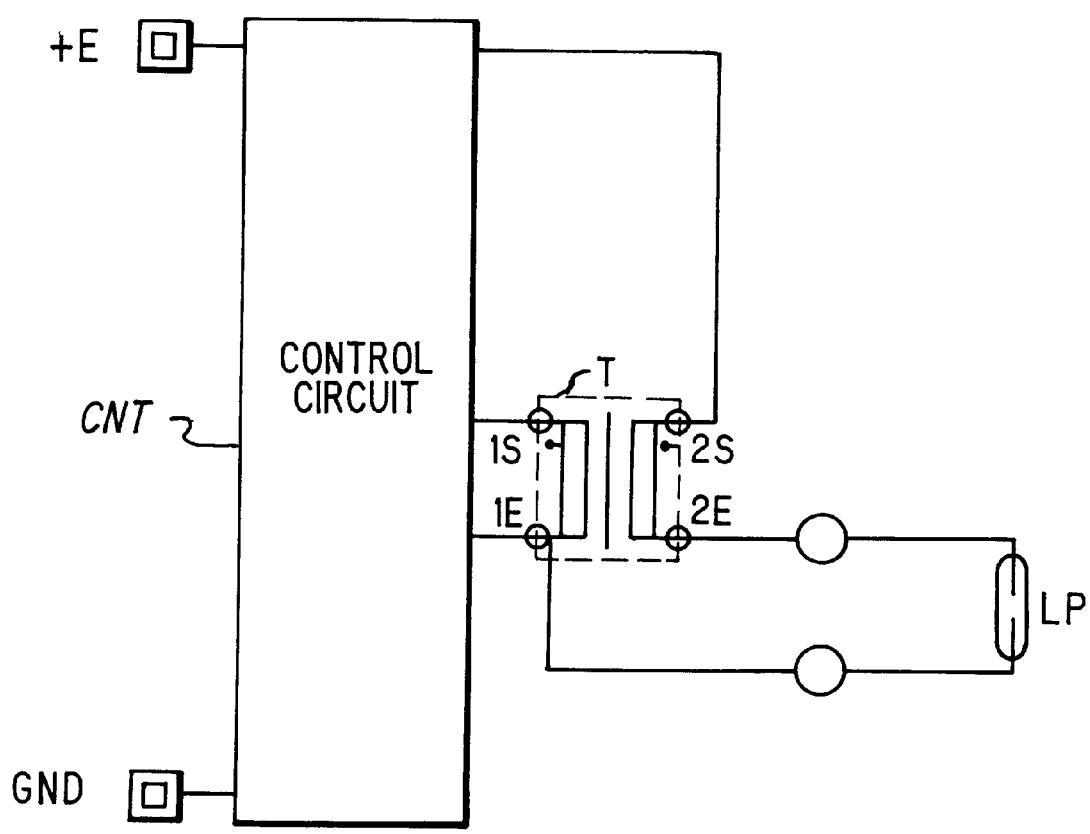
FIG. 5 is a block diagram of a lighting circuit of the discharge lamp unit of FIG. 1.

FIG. 5 is illustrative of a lamp-lighting circuit for lighting a discharge lamp LP, which has a control circuit CNT that receives a driving voltage E (DC 400 v) when a lamp switch (not shown) is turned on and the controlled voltage is applied to the primary side of the high-voltage generating transformer T that in turn produces at its secondary side a high voltage (about 25 KV) for lighting the discharge lamp. After lighting the discharge lamp by applying the high voltage for an initial firing period, the control circuit CNT operates to directly supply the discharge lamp with a working voltage (100 V) through the secondary side coil of the high-voltage generating transformer T to maintain the lamp in a lightning mode.

Figure 6:
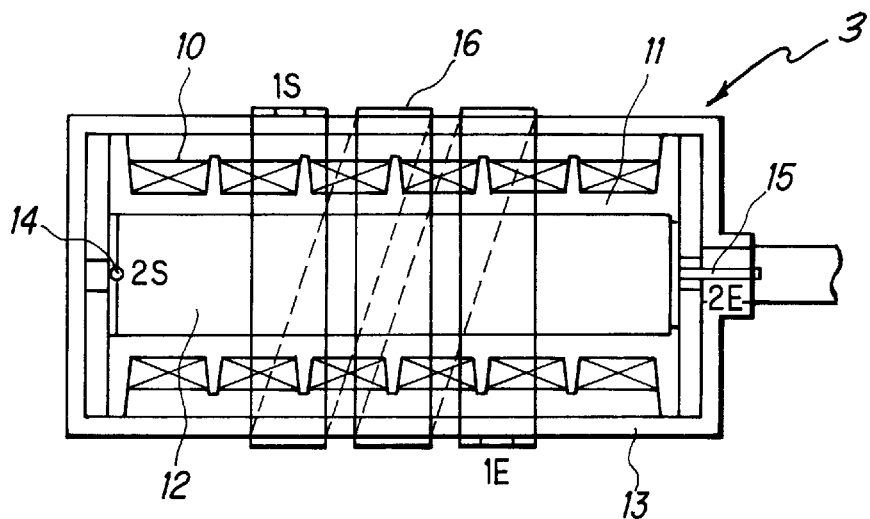
FIG. 6 is a plan view of a high-voltage generating transformer of the discharge lamp unit of FIG. 1.
Figure 7:
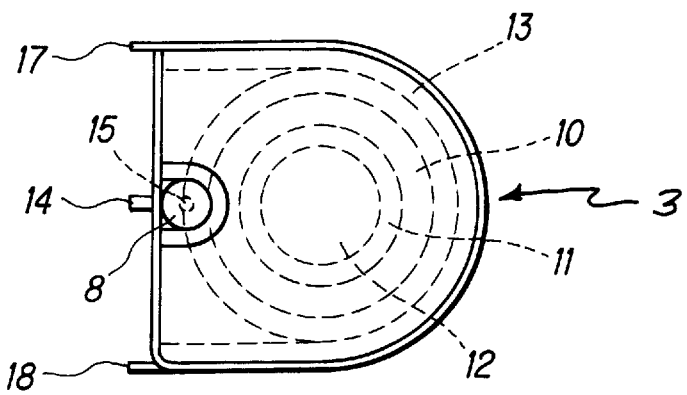
FIG. 7 is a side view of the high-voltage generating transformer of FIG. 6.
Figure 8:
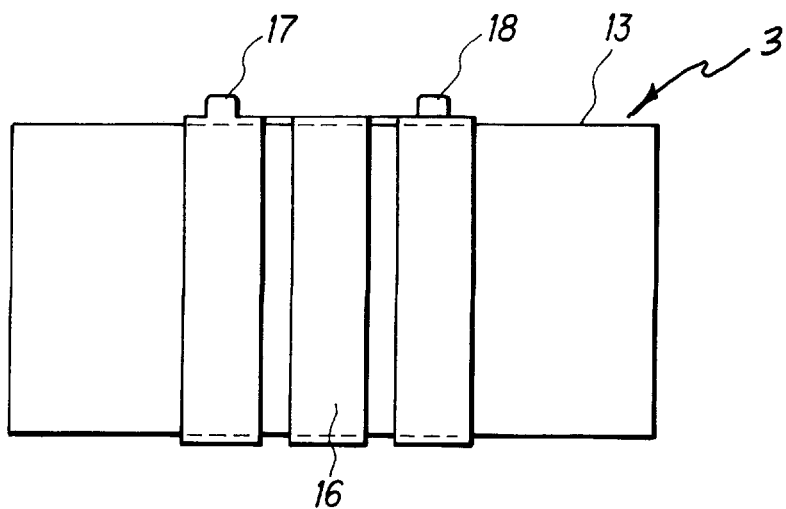
FIG. 8 is a top view of the high-voltage generating transformer of FIG. 6.
Figure 9:
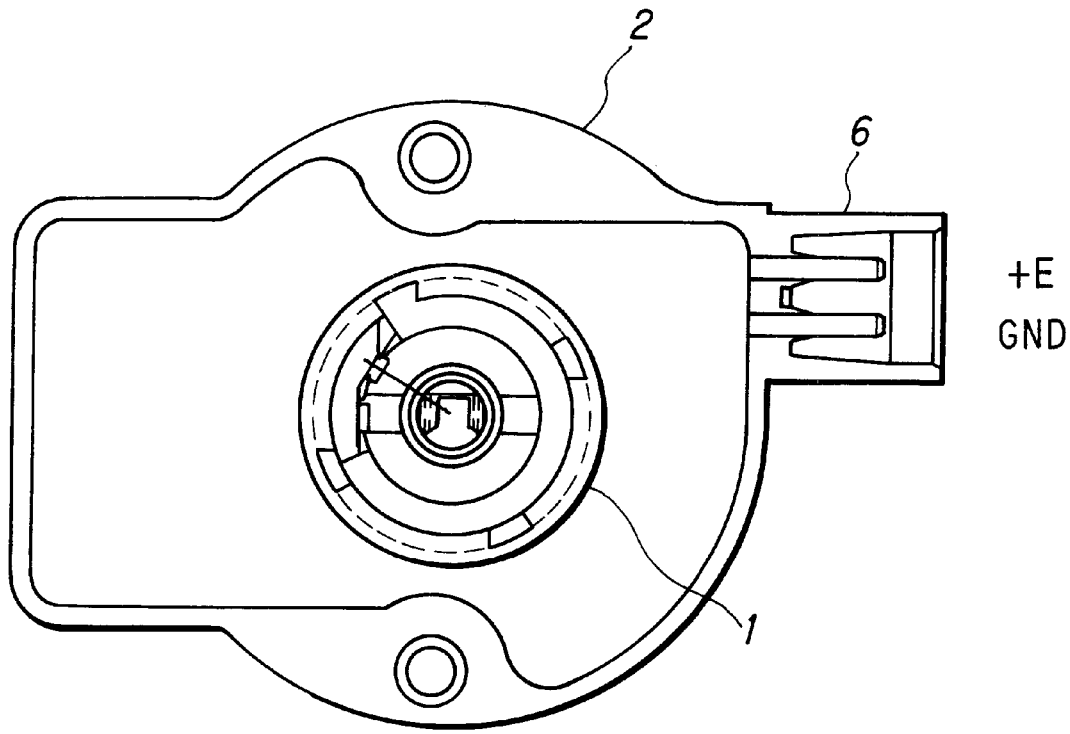
FIG. 9 is a plan view of a discharge lamp unit according to another aspect of the present invention.
Figure 10:
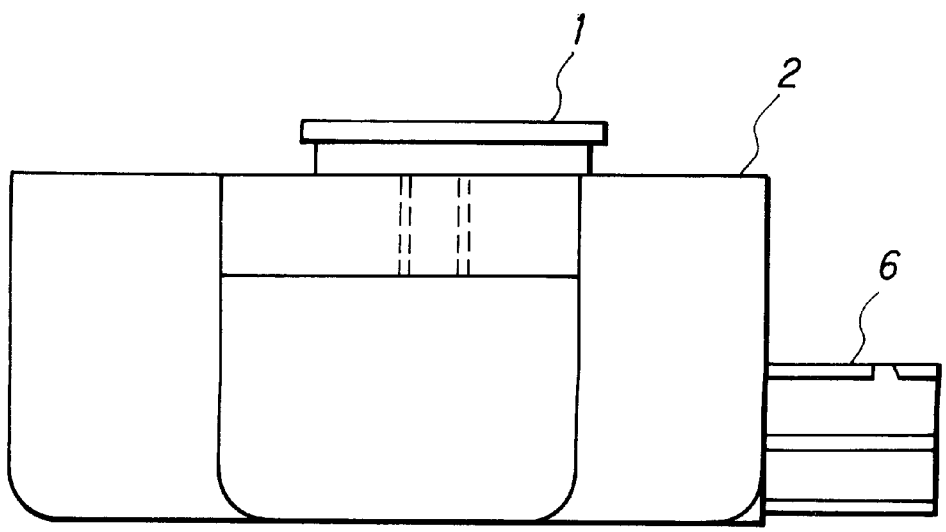
FIG. 10 is a front end view of the discharge lamp unit of FIG. 9.
Figure 11:
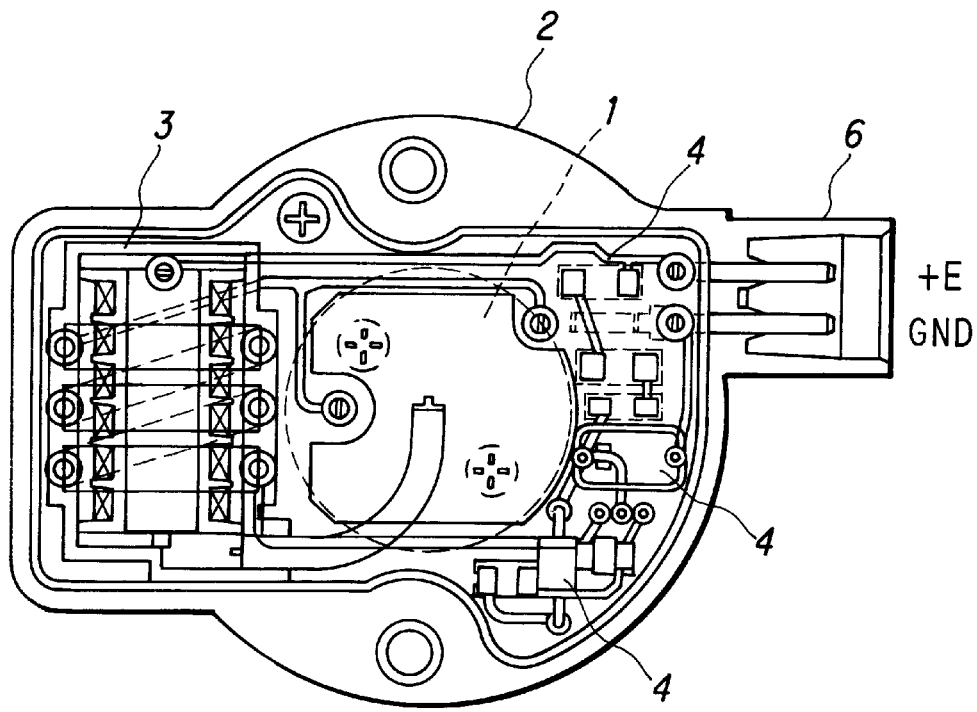
FIG. 11 is a sectional plan view of the discharge lamp unit of FIG. 9.
Figure 12:
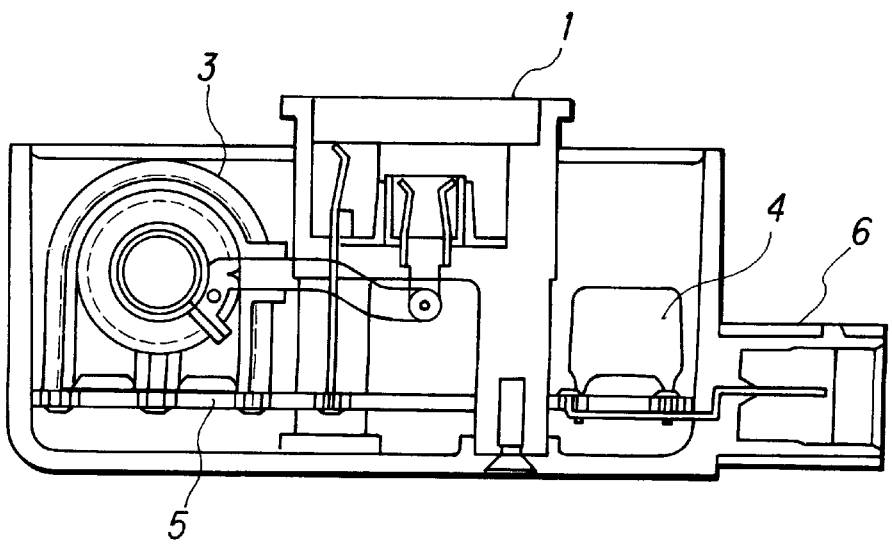
FIG. 12 is a longitudinal sectional view of the discharge lamp unit of FIG. 9.

The high-voltage generating transformer assembly 3 is constructed as shown in FIGS. 6 to 8.

A coil bobbin 11 with a secondary coil 10 wound thereon and a rod-like core 12 inserted in the bobbin's hollow center is mounted in a coil case 13 shaped in the form of an open-top tub. Both ends of a secondary coil 10 (not shown in detail) are connected with respective wires to corresponding terminal pins 14 (for low-voltage output) and 15 (for high-voltage output) provided for external wiring at the coil case 13. All of the inside components are then integrally potted in the coil case 13 with insulating resin poured in a melted state and solidified therein. The coil case 13 is further provided with an elastic-metal-made conducting plate 16 spirally wound thereon, which functions as a primary coil as well as a shield of the coil case.

The conducting plate 16 as the primary coil assembly 3 has 3.5 turns and the secondary coil 10 has 330 turns to generate a high voltage of about 25 KV at the secondary side of the high-voltage generating transformer. The conducting plate 16 has a power-side terminal 17 and a GND-side terminal 18, both of which are projecting therefrom.

The high-voltage generating transformer assembly 3 can be directly mounted on the printed circuit board 5 by connecting the power-side terminal 17 and the GND-side terminal 18 of the primary coil (conducting plate 16) and the low-voltage output-terminal pin 14 of the secondary coil to given positions on the board.

The high-voltage generating transformer assembly 3 is thus covered with the conducting plate 16 spirally wound thereon, which can prevent current from leaking outwards from the high-voltage-side of the transformer. In the high-voltage generating assembly 3, the conducting plate 16 can also serve as an electromagnetic shield for effectively protecting all of the surrounding electric components from the possible undesired effect of the high-voltage produced for initial firing of the discharge lamp LP.

According to the shown aspect of the present invention, the high-voltage generating transformer assembly 3 is effectively reduced in size and weight with an effective shield to be optimally adapted to mount on the printed circuit board 5. The printed circuit board 5 implemented with the lamp-lighting control circuit CNT together with the high-voltage-generating transformer assembly 3 is mounted in the compact housing 2 provided with a discharge-lamp socket 1 fitted thereon and the power-supply socket portion 6 integrally formed thereon. The discharge lamp unit can be directly mounted in a limited space of a headlight mounting portion of the vehicle. This unit is easy to assemble since it requires only connection of a power source to the power-supply socket formed thereon, eliminating the need of using an elongated high-voltage cable.

Another aspect of the present invention is shown in FIGS. 9 to 12, wherein a housing 2 is provided at its center portion with a discharge lamp socket 1 and accommodates a high-voltage generating transformer assembly 3 and lamp-lighting circuit elements 4 in a space surrounding the discharge lamp socket 1. This realizes further reduction in size of the discharge lamp unit.

As will be apparent from the foregoing, the discharge lamp unit according to the present invention is advantageous in its compact and safety design which is realized by mounting a printed circuit board implemented with a high-voltage transformer assembly and circuit elements into a compact housing provided with a discharging lamp socket fitted therein, wherein a high-voltage generating assembly of a reduced size and weight and having an effective shield is adapted to mount on a printed circuit board, thus enabling the printed circuit board with the transformer assembly and the lamp-lighting circuit to be integrally mounted in the housing.

What is claimed is:

1. A discharge lamp unit having a housing with a discharge lamp socket fitted thereon and accommodating therein a printed circuit board mounting thereon a lamp-lighting circuit and a high voltage generating transformer assembly, said assembly consisting of a primary coil being a plate conductor spirally wound around a coil case containing a secondary coil-wound bobbin with a core inserted in a hollow center thereof, wherein the printed circuit board with the lamplighting circuit and the transformer assembly is potted in the housing with insulating resin poured in a melted state and solidified therein to form a single solid unit.

2. The discharge lamp unit of claim 1, wherein said primary coil is comprised of a wide and thin metal strip wound on said coil case with spaces between adjacent windings being less than the width of said metal strip for forming a conductive shield encircling said secondary coil.

3. The discharge lamp unit of claim 1, wherein said coil case of an open-top tub shape for receiving and being completely filled by said insulating resin.

* * * * *